(12) United States Patent  
Jain et al.

(10) Patent No.: US 8,546,067 B2  
(45) Date of Patent: Oct. 1, 2013

(54) MATERIAL ASSISTED LASER ABLATION

(75) Inventors: Kanti Jain, Urbana, IL (US); Junghun Chae, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 943 days.

(21) Appl. No.: 12/052,980

(22) Filed: Mar. 21, 2008

(65) Prior Publication Data

US 2009/0239042 A1 Sep. 24, 2009

(51) Int. Cl.
*G03F 7/20* (2006.01)

(52) U.S. Cl.
USPC .......................................................... 430/322

(58) Field of Classification Search
USPC .................................. 430/311, 322; 264/400
See application file for complete search history.

(56) References Cited

U.S. PATENT DOCUMENTS

| | | | |
|---|---|---|---|
| 4,334,349 A | 6/1982 | Aoyama et al. | |
| 4,414,059 A | 11/1983 | Blum et al. | |
| 4,700,462 A | 10/1987 | Beaubien et al. | |
| 4,780,177 A | 10/1988 | Wojnarowski et al. | |
| 4,842,677 A | 6/1989 | Wojnarowski et al. | |
| 4,865,873 A | 9/1989 | Cole et al. | |
| 4,877,644 A | 10/1989 | Wu et al. | |
| 4,959,326 A | 9/1990 | Roman et al. | |
| 5,053,348 A | 10/1991 | Mishra et al. | |
| 5,155,053 A | 10/1992 | Atkinson | |
| 5,232,549 A | 8/1993 | Cathey et al. | |
| 5,285,236 A | 2/1994 | Jain | |
| 5,455,145 A * | 10/1995 | Tarumoto ..................... 430/325 | |
| 5,514,618 A | 5/1996 | Hunter, Jr. et al. | |
| 5,679,472 A | 10/1997 | Wu et al. | |
| 5,702,565 A | 12/1997 | Wu et al. | |
| 5,908,719 A | 6/1999 | Guckel et al. | |
| 5,976,968 A | 11/1999 | Dai | |
| 6,140,226 A | 10/2000 | Grill et al. | |
| 6,277,318 B1 | 8/2001 | Bower et al. | |
| 6,289,751 B1 | 9/2001 | Mathur et al. | |
| 6,348,295 B1 | 2/2002 | Griffith et al. | |
| 6,355,399 B1 | 3/2002 | Sajan et al. | |
| 6,448,176 B1 | 9/2002 | Grill et al. | |
| 6,495,448 B1 | 12/2002 | Lee | |
| 6,593,687 B1 | 7/2003 | Pei et al. | |
| 6,714,810 B2 | 3/2004 | Grzeszczuk et al. | |
| 6,717,650 B2 | 4/2004 | Jain | |

(Continued)

FOREIGN PATENT DOCUMENTS

TW         0488028 B       5/2002
WO     WO 2005/086982   *   9/2005

OTHER PUBLICATIONS

International Search Report, Corresponding to International Application No. PCT/US07/78516, Mailed Mar. 27, 2008.

(Continued)

*Primary Examiner* — Brittany Raymond
(74) *Attorney, Agent, or Firm* — Lathrop & Gage LLP

(57) ABSTRACT

This invention provides photoablation—based processing techniques and materials strategies for making, assembling and integrating patterns of materials for the fabrication of electronic, optical and opto-electronic devices. Processing techniques of the present invention enable high resolution and/or large area patterning and integration of porous and/or nano- or micro-structured materials comprising active or passive components of a range of electronic devices, including integrated circuits (IC), microelectronic and macroelectronic systems, microfluidic devices, biomedical devices, sensing devices and device arrays, and nano- and microelectromechanical systems.

43 Claims, 7 Drawing Sheets

(56) References Cited

U.S. PATENT DOCUMENTS

| | | | |
|---|---|---|---|
| 6,962,771 | B1 | 11/2005 | Liu et al. |
| 6,988,925 | B2 | 1/2006 | Arthur et al. |
| 7,078,351 | B2 | 7/2006 | Chiu et al. |
| 7,095,484 | B1 | 8/2006 | Fries |
| 7,167,296 | B2 | 1/2007 | Meisburger |
| 7,180,575 | B2 | 2/2007 | Kasumi et al. |
| 7,196,005 | B2 | 3/2007 | Ho |
| 7,264,990 | B2 | 9/2007 | Rueckes et al. |
| 2004/0125254 | A1 | 7/2004 | Chae et al. |
| 2005/0067286 | A1 | 3/2005 | Ahn et al. |
| 2005/0147895 | A1 | 7/2005 | Chang et al. |
| 2005/0158668 | A1 | 7/2005 | Bittner et al. |
| 2005/0185891 | A1 | 8/2005 | Kim et al. |
| 2006/0063351 | A1 | 3/2006 | Jain |
| 2006/0099731 | A1 | 5/2006 | Buckley et al. |
| 2006/0188721 | A1 | 8/2006 | Irvin, Jr. et al. |
| 2006/0289976 | A1 | 12/2006 | Min |
| 2007/0003878 | A1 | 1/2007 | Paxton et al. |
| 2007/0026674 | A1* | 2/2007 | Chen .............................. 438/689 |
| 2007/0281247 | A1* | 12/2007 | Phillips et al. ................. 430/311 |
| 2008/0057437 | A1* | 3/2008 | Sugasaki ..................... 430/270.1 |
| 2008/0161476 | A1* | 7/2008 | Sugasaki ........................ 524/496 |
| 2010/0098904 | A1* | 4/2010 | Dai et al. ....................... 428/119 |
| 2010/0155786 | A1* | 6/2010 | Heald et al. .................... 257/213 |

OTHER PUBLICATIONS

Lee et al. (Jul. 2005) "Sub-50 nm T-gate Pseudomorphic HEMTs Using Low Temperature Development Method," *Proceedings of 2005 5$^{th}$ IEEE Conference on Nanotechnology*, Nagoya, Japan.

Written Opinion, Corresponding to International Application No. PCT/US07/78516, Completed Jan. 24, 2008.

Chae et al. (2007) "Patterning of Indium Tin Oxide by Projection Photoablation and Lift-Off Process for Fabrication of Flat-Panel Displays," *Appl. Phys. Lett.* 90:261102.

Chae et al. (Jan. 29, 2008) "Excimer Laser Projection Photoablation and Lift-Off Process for Patterning of Indium-Tin-Oxide for Cost Effective Fabrication of Flat-Panel Displays," *Proc. SPIE* 6911:69110P.

Chen et al. (Nov. 1999) "Electron Beam Lithography Process for T- and Γ-Shaped Gate Fabrication Using Chemically Amplified DUV Resists and PMMA," *J. Vac. Sci. Technol. B*. 17(6):2507-2511.

Chen et al. (2002) "Thin Film Patterning by Laser Lift-Off," *Jpn. J. Appl. Phys.* 41:3099-3100.

Choi et al. (2001) "Electrophoresis Deposition of Carbon Nanotubes for Triode-Type Filed Emission Display," *Appl. Phys. Lett.* 78(11):1547-1549.

Choi et al. (1999) "Fully Sealed, High-Brightness Carbon-Nanotube Field-Emission Display," *Appl. Phys. Lett.* 75(20):3129-3131.

Dharap et al. (2004) "Nanotube Film Based on Single-Wall Carbon Nanotubes for Strain Sensing," *Nanotech.* 15:379-382.

Duley et al. (1996) "Interactions and Effects in Semiconductors," In; *UV Lasers: Effects and Applications in Materials Science*, Cambridge University Press, Cambridge, UK, pp. 308-356.

Fennimore et al. (Jul. 24, 2003) "Rotational Actuators Based on Carbon Nanotubes," *Nature* 424:408-410.

Grundbacher et al. (Jan. 1997) "Single Step Lithography for Double Recessed Gate Pseudomorphic High Electron Mobility Transistors," *J. Vac. Sci. Technol. B* 15(1):49-52.

Hayes et al. (2001) "A Laser-Ablation and Lift-Off Technique for Fabricating Simple Microfluidic Devices," *Proc. SPIE* 4236:115-125.

Huemoeller et al. (Jun. 2007) "Unveiling the Next Generation in Integrated Circuit Substrate Circuit Formation," *CircuiTree* 20(6):12.

Hwu et al. (2003) "A Novel Double-Recessed 0.2-μm T-Gate Process for Heterostructure InGap-InGaAs Doped-Channel FET Fabrication," *IEEE Electron. Dev. Lett.* 24(6):381-383.

Jain, K. (1990) "Excimer Laser Etching and Deposition," In; *Excimer Laser Lithography*, SPIE Press, Bellingham, WA, pp. 176-189.

Jain et al. (Aug. 2005) "Flexible Electronics and Displays: High-Resolution, Roll-to-Roll, Projection Lithography and Photoablation Processing Technologies for High-Throughput Production," *Proc. IEEE* 93(8):1500-1510.

Jain et al. (Oct. 2002) "Large-Area, High-Resolution Lithography and Photoablation Systems for Microelectronics and Optoelectronics Fabrication," *Proc. IEEE* 90(10):1681-1688.

Jain et al. (Aug. 2002) "Large-Area Excimer Laser Lithography and Photoablation Systems," *Microlithography World* 11(3):8-10.

Klosner et al. (Jul. 2002) "High Resolution, Large Area Projection Lithography Offers a New Alternative for Wafer-Level Packaging," *Chip Scale Review* 6(4):75.

Kocabas et al. (2007) "Experimental and Theoretical Studies of Transport Through Large Scale, Partially Aligned Arrays of Single-Walled Carbon Nanotubes in Thin Film Type Transistors," *Nano Lett.* 7(5):1195-1202.

Lee et al. (Jul. 2006) "Process for 20nm T Gate on $Al_{0.25}Ga_{0.75}As/In_{0.2}Ga_{0.8}As$/GaAs Epilayer Using Two-Step Lithography and Zig-zag Foot," *J. Vac. Sci. Technol. B* 24(4):1869-1872.

Lin et al. (Jul. 2004) "Single Step Electron-Beam Lithography for Asymmetric Recess and Gamma Gate in High Electron Mobility Transistor Fabrication," *J. Vac. Sci. Technol. B* 22(4):1723-1726.

Liu et al. (Nov. 12, 2001) "Carbon Nanotube Field-Effect Inverters," *Appl. Phys. Lett.* 79(20):3329-3331.

Lu et al. (Jun. 21, 2006) "Nanotube Micro-Optomechanical Actuators," *Appl. Phys. Lett.* 88:253107.

Lu et al. (1995) "Laser-Induced Dry Lift-Off Process," *Jpn. J. Appl. Phys.* 34:L1669-L1670.

Mancini et al. (Aug. 2002) "T-Gate Fabrication for GaAs Processing," *Microlithography World*.

Martel, R. (2002) "Nanotube Electronics: High-Performance Transistors," *Nature. Mat.* 1:203-204.

Meitl et al. (2004) "Solution Casting and Transfer Printing Single-Walled Carbon Nanotube Films," *Nano Lett.* 4(9):1643-1647.

Molpeceres et al. (2005) "Microprocessing of ITO and a-Si Thin Films Using ns Laser Sources," *J. Micromech. Microeng.* 15:1271-1278.

Oh et al. (2003) "Room Temperature Fabrication of High-Resolution Carbon Nanotube Field-Emission Cathodes by Self-Assembly," *Appl. Phys. Lett.* 82(15):2521-2523.

Pasquier et al. (Nov. 10, 2005) "Conducting and Transparent Single-Wall Carbon Nanotube Electrodes for Polymer-Fullerene Solar Cells," *Appl. Phys. Lett.* 87:203511.

Robin et al. (Nov. 2000) "Evolutionary Optimization of the Electron-Beam Lithography Process for Gate Fabrication of High Electron Mobility Transistors," *J. Vac. Sci. Technol. B* 18(6):3445-3449.

Srinivasan et al. (Sep. 15, 1982) "Self-Developing Photoetching of Poly(ethylene Terephthalate) Films by Far-Ultraviolet Excimer Laser Radiation," *Appl. Phys. Lett.* 41:576.

Tabatabaie-Alavi et al. (Aug. 2003) "Evolution of T-Shaped Gate Lithography for Compound Semiconductors Field-Effect Transistors," *IEEE Trans. Semicon. Manufac.* 16(3):365-369.

Thompson et al. (Nov. 1990) "High Aspect Ratio Asymmetric Gate Structures Employed in Novel Self-Aligned High Electron Mobility Transistor Technology," *J. Vac. Sci. Technol. B* 8(6):1339-1342.

Yavas et al. (1999) "High-Speed Maskless Laser Patterning of Thin Films for Giant Microelectronics," *J. Appl. Phys.* 38:7131-7134.

Yavas et al. (1999) "Effect of Substrate Absorption on the Efficiency of Laser Patterning of Indium Tin Oxide Thin Films," *J. Appl. Phys.* 85(8):4207-4212.

\* cited by examiner

MATERIAL ASSISTED LASER ABLATION

CROSS-REFERENCE TO RELATED APPLICATIONS

Not applicable.

STATEMENT REGARDING FEDERALLY SPONSORED RESEARCH OR DEVELOPMENT

Not Applicable.

BACKGROUND OF INVENTION

A great deal of research has been directed over the last several decades toward characterizing the composition and properties of carbon nanomaterials, and developing efficient pathways for making, purifying and using this unique class of materials. The extraordinary mechanical, electronic and chemical properties of carbon nanotubes, for example, have stimulated significant interest in developing applied technologies exploiting these useful properties. As a result, carbon nanotubes are currently identified as a promising class of functional materials for electronic and opto-electronic systems, and there is substantial interest in developing advanced techniques for integrating carbon nanotube materials into useful devices and systems.

Carbon nanotubes are allotropes of carbon comprising one or more cylindrically configured graphene sheets, which are classified on the basis of structure as either single walled carbon nanotubes (SWNTs) or multiwalled carbon nanotubes (MWNTs). Having small diameters ($\approx$1-30 nanometers) and large lengths (up to several microns), SWNTs and MWNTs are characterized by very large aspect ratios (i.e., length to diameter ratio $\approx 10^3$ to about $10^5$). Carbon nanotubes exhibit an energy band structure that varies considerably depending on their precise molecular geometry and chemical environment, and are either metallic or semiconducting in electronic character. Charge transfer doping and intercalation reactions have been shown to provide effective techniques for accessing doped carbon nanotube materials having selected electronic and chemical properties.

Single walled carbon nanotubes (SWNTs), in particular, are identified as functional materials potentially enabling a new generation of high performance passive and active nanotube-based electronic and opto-electronic devices. SWNTs comprise a single, contiguous graphene sheet wrapped around and joined with itself to form a hollow, seamless tube having capped ends. Typically having extremely small cross sectional dimensions (e.g., diameters $\approx$1-5 nanometer), SWNTs are often present in bundled configurations. SWNTs have been demonstrated to exhibit a high degree of chemical versatility and are capable of functionalization of their exterior surfaces and encapsulation of a range of materials within their central hollow cores, including gases, molten materials and biological materials.

SWNTs exhibit attractive electrical properties for target applications in micro- and macroelectronics. The electron transport behavior in carbon nanotubes, for example, is predicted to be essentially that of a quantum wire, which has stimulated interest in fabricating ultrafast nanotube based devices. In addition, charge transfer and intercalation doping processing pathways provide avenues for selectively tuning the electrical and chemical properties of carbon nanotubes to facilitate integration in specific electronics applications. SWNTs have also been demonstrated to have very high intrinsic field effect mobilities (e.g., up to about 9000 $cm^2 V^{-1} s^{-1}$) making them interesting for possible applications in nanoelectronics. Due to their nanometer size diameter, mechanical robustness, chemical stability and high electrical conductivity, SWNTs are being developed as enhanced field emitters in a range of devices, including flat panel displays, AFM tips and electron microscopes. SWNTs also possess useful thermal, mechanical, magnetic and optical properties which make them suitable materials for other nanotube-based emerging technologies. The unique mechanical properties of SWNTS, for example, make them attractive as additives in high strength, low weight and high performance composite materials. Calculations and experimental results suggest that SWNTs have tensile strengths at least 100 times that of steel or any known other known fiber, and that SWNTs are stiffer than conventional reinforcement materials, such as carbon fibers, while also exhibiting a very large Young's Modulus (as large as about 1 TPa) when distorted in some directions.

The unique combination of electronic and mechanical properties of SWNTs, make them particularly well-suited for use in large-scale distributed electronics. Target applications currently of high interest include high resolution display systems (e.g., flat panel displays, cathode ray tubes, liquid crystal displays, etc.), steerable antenna arrays, flexible electronics, and large area sensors. High resolution patterning of carbon nanotubes is a necessary processing step for many of these applications. Commercial implementation of this technology, therefore, requires the development of advanced techniques for patterning, assembling and integrating carbon nanotubes capable of satisfying important device processing requirements. First, processing techniques must be capable of patterning in a manner which avoids degradation or damage of the nanotubes, thereby retaining the electronic and mechanical properties necessary to supporting implementation in high performance electronic devices. Second, nanotube patterning techniques must be sufficiently versatile to support device fabrication on a range of electronic device substrates, including flexible, polymer-based substrates and substrates prepatterned with device components. Third, processing techniques must be capable of commercially feasible implementation, for example, for high resolution patterning and/or large area patterning applications.

Given their high degree of chemical and physical stability, conventional patterning techniques are inadequate to fully support commercial implementation of nanotube-based electronic systems. As a result, a number of new processing strategies have been proposed and explored to address the present need for nanotube-based electronic devices. Despite this activity, there is currently a significant need for the development of processing techniques for patterning carbon nanotubes.

Choi et al. report carbon nanotube patterning using an electrophoresis method, wherein the nanotubes are grown selectively on a patterned indium tin oxide (ITO) layer. [See, W. B. Choi et al., Electrophoresis deposition of carbon nanotubes for triode-type field emission display, Applied Physics Letters, vol. 78, no. 11, p 1547, 2001]. The authors report that the technique is capable of generating a high resolution pattern of the electrophoresis deposited carbon nantoubes on the ITO underlayer. The processing strategy described by Choi et al. is susceptible to significant drawbacks, however, that hinder its commercial implementation. The patterning technique requires a resource intensive prepatterning step of the ITO underlayer to generate the desired carbon nanotube pattern. Also, it is expected that the physical and electronic characteristics of carbon nanotubes deposited by electrophoresis may not be sufficient to support applications in high performance electronics, as it is generally accepted that carbon nanotubes grown by high temperature chemical vapor deposition (CVD) techniques have superior properties. Choi et al. also describe a screen printing-based processing technique for patterning carbon nanotube materials. [See, W. B. Choi et al., Fully sealed, high-brightness carbon-nanotube field-emission display, Applied Physics Letters, vol. 75, no. 20, p 3130, 1999]. In these methods, solvents are added to a carbon nanotube-containing powder to make paste that is subsequently printed selectively on a substrate for a field emission display device. While the method is reported to provide a pattern having reasonable fidelity on the device substrate, the deposited carbon nanotubes are also likely to have inferior electronic and physical properties relative to methods using CVD to generate nanotubes directly on the substrate. The screen-printing approach is also likely to be susceptible to problems arising from low pattern resolution and inefficient use of the carbon nanotube material.

Oh et al. report room temperature methods using self-assembly of carbon nanotubes to achieve patterning on substrates. [See, S. Oh et al., Room temperature fabrication of high resolution carbon nanotube field emission cathodes by self-assembly, Applied Physics Letters, vol. 82, no. 15, 2521, 20]. In the reported method, alternating hydrophilic and hydrophobic regions are defined on the substrate surface prior to carbon nanotube deposition. A homogeneous suspension of carbon nanotubes is then applied to the substrate surface having the hydrophilic and hydrophobic regions. Carbon nanotubes are demonstrated to only coat the hydrophilic surface, thereby achieving substrate patterning. Similar to the work of Choi et al., although patterning was achieved, the deposited carbon nanotubes are likely to have inferior electronic and physical properties relative to methods using CVD to generate nanotubes directly on the substrate undergoing processing.

S. Lu et al. disclose a patterning process reportedly capable of generating high resolution patterns exhibiting fine features of patterned carbon nanotubes. [S. Lu et al., Nanotube micro-optomechanical actuators, Applied Physics Letters, vol 88, p 253107, 2006]. In the disclosed technique, a uniform layer of carbon nanotubes of a desired thickness is first generated on a substrate surface by compressive loading. The deposited layer of carbon nantoubes is subsequently patterned by a combination of processing steps involving selective masking using conventional photolithography followed by selective removal of carbon nantoubes in exposed regions using an oxygen plasma. It is expected that the oxygen plasma attacks the defects in the carbon nanotubes, and the etching of carbon nanotubes progresses from the defect point to the normal structure. A disadvantage of this technique is that selective removal of the carbon nanotubes using oxygen plasma requires long processing times, which hinders commercial implementation of this technique.

Other references that disclose carbon nanotube processing techniques for making electronic devices include U.S. Pat. Nos. 7,264,990, 6,988,925, 6,277,318 and 6,348,295 and International Patent Publication No. WO 2005/086982.

SUMMARY OF THE INVENTION

This invention provides photoablation—based processing techniques and materials strategies for making, assembling and integrating patterns of materials for the fabrication of electronic, optical and opto-electronic devices. Processing techniques of the present invention enable high resolution and/or large area patterning and integration of porous and/or nano- or micro-structured materials comprising active or passive components of a range of electronic devices, including integrated circuits (IC), microelectronic and macroelectronic systems, microfluidic devices, biomedical devices, sensing devices and device arrays, and nano- and microelectromechanical systems. In specific embodiments, methods of the present invention enable important processing steps and low cost fabrication strategies for laser ablation-based patterning and integration of nanomaterials and films thereof, including nanotubes (e.g., carbon nanotubes, SWNTs, MWNTs), nanowires (e.g., semiconducting, metallic or dielectric nanowires) and other nanoparticles, on device substrates prepatterned with device components, for example in the fabrication of large area display panel devices, including TFT-LCD (Thin Film Transistor-Liquid Crystal Display), OLED (Organic Light Emitting Display), PDP (Plasma Display Panel) and FED (Field Emission Display), and other macroelectronic systems.

Methods of the present invention provide a high-throughput, low cost, patterning platform for porous and/or nano-structured materials that is an alternative to conventional photolithography and direct laser ablation patterning techniques. The present methods are compatible with a range of patterned materials, including porous and/or nano-structured materials. The present methods extend the applicability of patterning via laser ablation to materials are that are especially difficult to pattern via direct laser ablation due to their chemical or physical properties (e.g., high chemical stability), such as nanotubes (e.g., carbon nanotubes, SWNTs, MWNTs), nanowires (e.g., semiconducting, metallic or dielectric nanowires) and other nanoparticles, and are capable of making patterns exhibiting high resolution, good pattern fidelity and high precision. Processing provided by the present methods is compatible with large area patterning of substrates, such as device substrates for semiconductor integrated circuits, displays, and macroelectronic device arrays and systems, and is useful for fabrication applications requiring patterning of layered materials, such as patterning thin film layers of nanomaterials, such as nanotubes and nanowires, in thin film electronic devices. The processing methods of the present invention can be implemented with a range of substrates including semiconductor substrates, ceramic substrates, optically transparent substrates, flexible substrates (e.g., polymers) and device substrates prepatterned with electronic device components. Processing methods of the present invention are complementary to conventional microfabrication and nanofabrication methods for making integrated electronics, and can be effectively integrated into existing photolithographic, etching, and thin film deposition patterning systems, processes and infrastructure.

In an aspect, the present invention provides a method of processing a substrate wherein a photoablation assisting material is integrated into a layer of a target material provided on a substrate surface, thereby allowing for spatially selective removal of the target material via photoablation (e.g., laser ablation) to achieve high resolution patterning. In an embodiment of this aspect, for example, the invention provides a method of patterning a substrate with a microstructured or nanostructured target material, such as nanotubes (e.g., carbon nanotubes, SWNTs, MWNTs), nanowires (e.g., semiconducting, metallic or dielectric nanowires), nanoparticles, microparticles, and nanoporous or microporous materials. In an embodiment, the method comprises the steps of: (i) providing a layer of the target material on a surface of the substrate; (ii) contacting the layer of target material with a photoablation assisting material, wherein the photoablation assisting material at least partially integrates into the layer target material, thereby generating a layer of target material integrated with the photoablation assisting material; and (iii)

removing target material from selected regions of the layer of target material integrated with the photoablation assisting material by photoablation, thereby patterning the substrate with the microstructured or nanostructured target material. In some embodiments, the present methods further comprise the step of removing photoablation assisting material after the step of removing target material from selected regions of the layer of target material integrated with the photoablation assisting material by photoablation, for example by development or dissolution of the photoablation assisting material.

In some methods of this aspect, patterned photoablation is used to remove target material integrated with the photoablation assisting material from selected regions of the layer that are exposed to electromagnetic radiation having wavelengths and energies (fluence) sufficient to initiate ablation of the photoablation assisting material. Some methods of this aspect further comprise the step of patterning photoablation assisting material provided in contact with the layer of target material, for example by selective removal of photoablation assisting material from preselected regions of the layer of target material, prior to removal of target material integrated with the photoablation assisting material via photoablation. Patterning of photoablation assisting material provided in contact with the layer of target material can be carried out by any means known in the art including, but not limited to, photolithography, development and dissolution techniques. Patterning of the photoablation assisting material is particularly useful in methods using a flood illumination technique for photoablation, as it can be used to precisely define the regions of the target material removed upon patterning, thereby eliminating the need for patterned illumination using photomasks and other optical systems for providing spatially selective exposure to electromagnetic radiation.

Photoablation patterning is achieved in certain embodiments of this aspect by exposing the layer of target material integrated with the photoablation assisting material, or selected regions thereof, to electromagnetic radiation having wavelengths and energies (e.g., fluence) capable of initiating ablative removal of the photoablation assisting material, wherein target material integrated with the photoablation assisting material is removed along with the photoablation assisting material during the photoablation process. In some embodiments, photoablation is carried out via a laser ablation technique. In some methods, for example, photoablation patterning of the target material is achieved using ablation conditions (e.g., wavelengths, fluences etc.) that are not capable of directly removing the target material in the absence of the photoablation assisting material. In this manner, patterning of the target material can be achieved using "soft" ablation conditions (e.g., wavelengths, fluences, etc.) that do not result in significant damage or degradation of the underlying substrate undergoing processing, or device components or structures prepatterned on the underlying substrate undergoing processing. Such "soft" ablation conditions allow target material to be effectively patterned on a wide range of substrates (e.g., polymer substrates) and allow for effective integration of target material with prepatterned device components supported by the substrate.

Photoablation assisting materials of this aspect of the present invention enable processing using ablation conditions attractive for patterning a range of target materials on a range of useful substrates. Photoablation assisting materials are ablatable materials capable of undergoing photoablation removal under processing conditions beneficial for device fabrication applications. Properties of photoablation assisting materials that enable patterning via the present methods include: (i) the ability to undergo ablative removal for selected photoablation conditions; and (ii) the capability of photoablation assisting materials to integrate into the target material sufficiently to cause removal of target material upon ablation of the photoablation assisting material. In the context of this description, "to integrate" and the "integration" process generally refers to physical and/or chemical association of the photoablation assisting material with the target material and/or features of the target material, such that subsequent ablation of the photoablation assisting material results in at least partial removal of target material associated with the photoablation assisting material. Photoablation assisting materials may be partially or completely integrated into the layer of target material, and optionally integrated into the bulk of a layer of target material. In some embodiments, for example, photoablation assisting material integrates into the layer of target material by diffusing, permeating, penetrating or otherwise transporting into the thickness of the layer of target material, and optionally into the entire thickness of the layer of target material provided on the substrate. Integration of photoablation assisting materials includes processes wherein photoablation assisting material occupies at least a portion of the pores of a porous layer of target material, or at least a portion of the spaces between particles comprising a layer of target material. Integration of photoablation assisting materials includes processes wherein photoablation assisting material penetrates underneath at least a portion of the target materials and/or a layer of target material, for example, by transport through pores, grain boundaries, channels and/or voids in the layer of target material. Integration of photoablation assisting materials includes processes wherein photoablation assisting material encapsulates, coats, fills or otherwise at least partially covers particles comprising the layer of target material or pores within the layer of target material.

In an exemplary embodiment, for example, photoablation assisting material integrates into a layer of target material by occupying at least a portion of the spaces between nanotubes, nanowires or other nanoparticles comprising the layer of target material, thereby at least partially coating a portion of the nanotubes, nanowires, or other nanoparticles. In an exemplary embodiment, for example, photoablation assisting material integrates into a layer of target material such that it penetrates a layer of nanotubes, nanowires or other nanoparticles comprising the layer of target material, thereby at least partially occupying spaces between at least a portion of the nanotubes, nanowires, or other nanoparticles and the substrate undergoing processing.

The present methods are useful for patterning a range of target materials, and are particularly attractive for patterning nano-structured and/or microstructured materials. In the context of the present description, the term "nanostructured" refers to a material, layer or other structure having one or more nanosized features, and the term "microstructured" refers to a material, layer or other structure having one or more microsized features In the context of this description, the term "nanosized" refers to features of a material, layer or other structure having at least one physical dimension, such as a cross sectional dimension or longitudinal dimension (e.g., width, thickness, height, length, diameter), that is less than about one micron, and the term "microsized" refers to features of material, layer or other structure having at least one physical dimension, such as a cross sectional dimension or longitudinal dimension (e.g., width, thickness, height, length, diameter), that that is within the range of 1 micron to 1000 microns. The present methods are particularly beneficial for patterning materials that are difficult or incapable of patterning using direct ablation methods. The present methods provide photoablation processing compatible with low fluence conditions useful for patterning a range of substrates with materials that otherwise would require conditions (e.g., short wavelength, high energies (fluences) etc.) for direct ablation that would damage or otherwise degrade a substrate undergoing processing. In an embodiment, the layer of target material provided to the substrate surface has a thickness selected over the range of 5 nm to 1000 microns.

Useful nano-structured and/or microstructured materials for patterning methods of the present invention include target materials comprising porous materials having nanosized and/or microsized pores, and includes target materials comprising nanosized and/or microsized particles. In an embodiment, for example, the target material comprises carbon nanoparticles, such as carbon nanotubes (SWNTs, MWNTs and/or carbon nanotube bundles), fullerenes, carbon nanofibers and carbon nanowiskers, and layers thereof. In an embodiment, the methods of the present invention further comprise the step of providing a target material comprising carbon nanoparticles, optionally comprising carbon nanotubes. For example, the present invention includes methods further comprising providing a layer of carbon nanotubes to the substrate surface using chemical vapor deposition for patterning the substrate with high quality nanotubes exhibiting electronic and mechanical properties supporting high performance electronics applications. In some embodiments, the methods of the present invention further comprise the step of growing the carbon nanotubes on the surface of the substrate using chemical vapor deposition; contacting the surface of the substrate with a solution of carbon nanotubes; providing carbon nanotube by arc-discharge deposition, or providing carbon nanotube by laser-ablation deposition. In another embodiment, for example, the target material comprises nanowires. The present methods are capable of patterning a range of nanowires including semiconducting nanowires, such as InP, Si, ZnO and GaN nanowires, metallic nanowires such as Ni, Pt, ZnO and Cu nanowires, and dielectric nanowires such $SiO_2$ and $TiO_2$ nanowires. In an embodiment, the methods of the present invention further comprise the step of providing a target material comprising nanowires, optionally comprising semiconducting, metallic, dielectric nanowires or any combination of these. The present invention includes methods further comprising providing a layer of nanowires to the substrate surface. In another embodiment, for example, the target materials comprises a porous material, for example, porous silicon (e.g., applications in MEMS, bio-MEMS), hydroxyapatite (e.g., applications in bio-MEMS), porous Pb—Zr—Ti—O (e.g., applications in MEMS, PZT), porous copper (e.g., applications in MEMS), porous Titania (e.g., applications in MEMS), and porous polysilazane (e.g., applications for optical components, PPSZ,)

Photoablation assisting materials that are capable of being ablated under low fluence conditions are particularly useful in the present methods. In some embodiments, the photoablation assisting material undergoes ablation at a fluence less than that required to initiate ablation of the target material being patterning in the absence of photoablation assisting material. In some embodiments, the photoablation assisting material undergoes ablation at a fluence less than or equal to 500 mJ cm$^{-2}$, preferably for some applications at a fluence less than or equal to 250 mJ cm$^{-2}$. In some embodiments, the photoablation assisting material is capable of undergoing ablation by exposure to electromagnetic radiation having wavelengths selected over the range of 100 nm to 1500 nm. In some embodiments, the photoablation assisting material has a has a viscosity that facilitates its integration with a nano- or micro-structured target material, for example a viscosity selected over the range of 0.1 mPa·s to 500 MPa·s. Photoablation assisting materials useful in the present methods include, but are not limited to, polymers and photoresists. In some embodiments, the photoablation assisting material is selected from the group consisting of polymethylmethacrylate (PMMA), polyimide, polyethylene terephathalate (PET), polystyrene, polycarbonate, polyvinyl alcohol (PVA), polybenzimidazole, and tetrafluoroethylene. Use of a photoablation assisting material comprising a photoresist is beneficial because it is compatible with infrastructure and processing conditions for making CMOS devices and systems, is easy to remove via developing or stripping, and can be ablated at low fluence conditions.

Contact between the target material and the photoablation assisting materials can be achieved in many ways in the present invention including, but not limited to, deposition, spin coating, spin casting, spraying, dipping, and printing methods. In an embodiment, for example, the step of contacting the layer of target material with a photoablation assisting material comprises providing a layer of the photoablation assisting material onto a surface of the layer of target material, for example a layer of target material having a thickness selected over the range of 5 nm to 1000 microns. In some embodiments, the layer of photoablation assisting material is provided in conformal contact with the layer of target material undergoing patterning. In some embodiments, the layer of target material is heated after contacting the photoablation assisting material to facilitate integration with the photoablation assisting material or to initiate fixing of the photoablation assisting material. In some embodiments, photoablation assisting material is provided in the liquid phase and contacted with the layer of target material to facilitate integration of these materials via diffusion or other transport process, optionally followed by a step of fixing the photoablation assisting material by causing a phase change from liquid to solid phases.

Methods of the present invention may further comprise the step of patterning the layer of photoablation assisting material provided on to the layer of target material to be patterned, for example using photolithography and development processing. Patterning of the photoablation assisting material applied to the layer of target material, for example, can be used to generate regions of the layer of target material that are integrated with photoablation assisting material, and regions of the layer of target material that are not integrated with photoablation assisting material. In these methods, exposure to electromagnetic radiation results in spatially selective removal of the regions of the layer target material having photoablation assisting material incorporated therein, thereby resulting in a pattern defined by the regions of the layer target material not integrated with the photoablation assisting material. In these embodiments, therefore, patterning of the photoablation assisting material defines, at least in part, the pattern of target material ultimately generated on the substrate surface. The present invention includes processing including both a step of patterning the layer of photoablation assisting material provided on to the layer of target material and a step of patterned illumination to initiate photoablation.

Specific methods of the present invention optionally further comprise the step of fixing the photoablatable material integrated into the target material undergoing processing, for example prior to photoablation processing of the target material. Advantages provided by methods having a fixing step including stabilizing and/or preferentially localizing the photoablation assisting material so as to access high resolution patterning functionality. Further benefits provided by methods including a fixing step include providing or enhancing adhesion of the target material to the substrate undergoing processing. As used herein, the term "fixing" refers to a process wherein a material changes viscosity, phase, density, and/or hardness, for example, by one or more processes selected from the group consisting of: curing, hardening, solidifying, exposure to electromagnetic radiation (e.g., photocuring), exposure to one or more curing agents, raising the temperature (e.g., baking), and cross linking of a photoablation assisting material comprising a prepolymer or polymer. In an embodiment, fixing causes a change of the phase of the photoablation assisting material from a liquid phase to a solid phase.

Specific methods of the present invention optionally further comprise the step of removing photoablation debris generated by photoablation processing. In the context of this description, photoablation debris generally refers to any unwanted material produced during photoablation processing including, removed or ablated target material, removed or ablated photoablation assisting material and/or derivatives and byproducts thereof. Photoablation debris removal may be carried out in the present invention, for example, by providing a flow of carrier gas, preferably for some applications an inert gas (e.g., $N_2$, Ar, He, $CO_2$, $O_2$, Ne, etc.), to the substrate surface undergoing processing during and/or after photoablation processing. In these embodiments, the flow of carrier gas sweeps the processed surface, thereby transporting away at least a portion of the photoablation debris. Removal of photoablation debris may also be carried out by additional processing steps including removal by exposure to a plasma, reactive gas(es), and/or reactive liquids (solvents, acids, bases, etc.) that selectively react with the photoablation debris. In an embodiment, the present methods include the step of exposing the substrate surface, target material or both to a oxygen plasma, for example for patterning a target material comprising a layer of carbon nanotubes.

Use of a photoablation assisting material in the present invention has an advantage over direct laser ablation pattering in that it allows processing conditions (e.g., radiative wavelengths, fluences, and energies) compatible with a wide range of processing applications and/or substrates undergoing processing. Another benefit provided by use of photoablation assisting materials is that low fluences of electromagnetic radiation can be used for patterning most target materials, such as a fluence less than or equal to 500 mJ $cm^{-2}$, preferably for some applications at a fluence less than or equal to 250 mJ $cm^{-2}$. In some embodiments, low fluence conditions refers to a fluence that is low enough such that it is not capable of providing direct ablation of the target material in the absence of photoablation assisting material. Patterning methods using low fluence conditions are beneficial for a number of reasons including: (i) photoinduced damage or degradation to the substrate or devices or device components prepatterned on the substrate is minimized or avoided entirely; (ii) the methods are compatible with use of less expensive optical sources for laser ablation; (iii) the lifetime of the optical components (e.g., lenses) of the ablation optical system is increased; (iv) the need for maintenance of the ablation optical system is decreased; and (v) the process can be carried out more safely than conventional high fluence ablation processing.

A range of photoablation systems and process conditions can be used in the present invention, including laser ablation systems and methods. The present invention includes methods using an optical photomask or other optical system providing spatially selective illumination of a layer of target material integrated with photoablation assisting material. Selective illumination in these processes determines the regions of target material removed upon ablation processing and, therefore, defines the pattern of target material generated on the substrate surface. In some embodiments, for example, patterned photoablation is used for processing wherein selected regions of the layer of target material incorporated with photoablation assisting material are exposed to electromagnetic radiation having wavelengths and energies (e.g., fluence) capable of initiating ablation of the photoablation assisting material, and selected regions of the layer of target material incorporated with photoablation assisting material are not exposed to electromagnetic radiation having wavelengths and fluence capable of initiating ablation. In these embodiments, target material incorporated with photoablation assisting material that is exposed to the electromagnetic radiation is removed by the force generated upon ablation of the photoablation assisting material, and target material not exposed to electromagnetic radiation capable of initiating ablation remains on the substrate, thereby defining the pattern generated on the substrate surface. Alternatively, the present invention includes methods wherein ablation is achieved using flood exposure/illumination conditions, and therefore does not require use of a optical photomask or other optical system for providing selective illumination of the layer of target material. In an embodiment, for example, the photoablation assisting material integrated with the layer of target material is patterned prior to exposure to electromagnetic radiation for initiating photoablation removal. Patterning of the photoablation assisting material may be carried out by techniques, including photolithography and development or dissolution conditions, capable of generating regions of the layer of target material integrated with the photoablation assisting material and regions of the layer of target material not having photoablation assisting material present. After patterning the photoablation assisting material, flood illumination of the layer of target material initiates ablation spatially restricted to the regions of the layer of target material integrated with the photoablation assisting material, wherein regions of target material not having photoablation assisting material present do not undergo ablative removal and, thereby defines the pattern generated on the substrate surface.

Photoablation removal of target material can be achieved using electromagnetic radiation in the ultraviolet, visible and near infrared regions of the electromagnetic spectrum. In an embodiment, the exposing step is carried out using electromagnetic radiation having wavelengths selected over the range 100 nm to 1500 nm. Photoablation removal of target material can be achieved using pulsed or continuous exposure to electromagnetic radiation having wavelengths and energies (e.g. fluence) capable of initiating ablation of the photoablation assisting material. Photoablation provides a very high degree of control over the physical dimensions and spatial orientations of removed regions of the layer of target material, thus enabling making high resolution patterns exhibiting good pattern fidelity. A range of optical sources can be used for ablation in the present invention including diode lasers, HeNe laser, rare-gas ion lasers (Ar-ion laser, Kr-ion laser), Metal vapor lasers (HeCd laser, Copper-vapor laser, Gold-vapor laser), Carbon dioxide laser, Carbon monoxide laser, Excimer lasers ($F_2$ laser, ArF laser, KrCl laser, KrF laser, XeCl laser, XeF laser), nitrogen laser, and Chemical lasers.

The processing methods of the present invention may be used to fabricate a range of electronic, opto-electronic and optical devices and systems. In some embodiments, the present methods are useful for patterning active or passive functional materials for fabricating a display device, an integrated circuit, a biomedical device, a microelectromechanical device, a nanoelectromechanical device, a sensor, an actuator or an interconnect network. The present methods are particularly attractive for processing a variety of display systems, including carbon nanotube-based display systems, selected from the group consisting of: TFT-LCD (Thin Film Transistor-Liquid Crystal Display), OLED (Organic Light Emitting Display), PDP (Plasma Display Panel) and FED (Field Emission Display).

The methods of the present invention are useful for processing a wide range of substrates. Substrates useful in the present invention can be virtually any composition, including semiconductor substrates, wafer substrates, thin film device substrates, flexible substrates, polymer substrates, ceramic substrates and glass substrates. The present methods are compatible with planar substrates and substrates having a contoured surface, such as convex and concave substrates. Substrates useful in the present methods include device substrates, for example, device substrates prepatterned with functional device components.

In an embodiment, the step of contacting the layer of target material with a photoablation assisting material comprises: providing a layer of the photoablation assisting material onto a surface of the layer of target material. In an embodiment, the layer of the photoablation assisting material is provided onto the surface of the layer of target material using a deposition, spin casting or spraying technique. In an embodiment, the method further comprises the step of: patterning the layer of photoablation assisting material by removing photoablation assisting material from selected regions of the layer of photoablation assisting material. In an embodiment, the step of patterning the layer of photoablation assisting material is carried out using photolithography and/or development techniques. In an embodiment, the layer of the photoablation assisting material provided to the layer of target material has a thickness selected over the range of 5 nm to 1000 microns.

In another aspect, the present invention provides a method for patterning a substrate with nanotubes or nanowires, comprising the steps of: (i) providing a layer of the nanotubes or nanowires on a surface of the substrate; (ii) contacting the layer of nanotubes or nanowires with a photoablation assisting material, wherein the photoablation assisting material is integrated into spaces between at least a portion of the nanotubes or nanowires of the layer, thereby generating a layer of nanotubes or nanowires integrated with the photoablation assisting material; and (iii) removing nanotubes or nanowires from selected regions of the layer of nanotubes or nanowires integrated with the photoablation assisting material by photoablation, thereby patterning the substrate with the nanotubes or nanowires. In an embodiment, the step of providing the layer of the nanotubes or nanowires comprises growing carbon nanotubes on the surface of the substrate using high temperature chemical vapor deposition. In an embodiment, the photoablation assisting material partially or completely integrates into the layer of nanotubes or nanowires. In an embodiment, the contacting step provides photoablation assisting material: (i) underneath at least apportion of the nanotubes or nanowires comprising the layer of target material, and/or (ii) coats at least a portion of the nanotubes or nanowires in the layer. In an embodiment, the nanotubes or nanowires are one or more materials selected from the group consisting of: single walled nanotubes, multiwalled nanotubes, carbon nanotube bundles, semiconducting nanwires, metallic nanowires and dielectric nanowires.

In an embodiment of this aspect, the photoablation assisting material partially integrates into the layer of nanotubes or nanowires. In an embodiment of this aspect, the photoablation assisting material completely integrates into the layer of nanotubes or nanowires. In an embodiment of this aspect, the contacting step provides photoablation assisting material underneath the layer of the nanotubes or nanowires, coats at least a portion of the nanotubes or nanowires in the layer or both. In an embodiment, the layer of the nanotubes or nanowires has a thickness selected over the range of 10 nm to 1000 microns. In an embodiment, the exposing step is carried out using a electromagnetic radiation having wavelengths selected over the range of 100 nm to 1500 nm.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

BRIEF DESCRIPTION OF THE DRAWINGS

FIGS. 7a and 7b provide optical microscopic photograph of patterned photoresist. The incident excimer laser fluence was 50 mJ/cm2 and the number of pulses was 40. FIG. 7a shows patterns obtained using a pixel photomask, and FIG. 7b shows patterns obtained using a line photomask. FIGS. 7(c) and 7(d) provide optical microscope photos of patterns formed in 2.2 µm thick photoresist layer on a KrF excimer laser photoablation workstation using a fluence of 50 mJ/cm2 at the substrate and 30 pulses at 5 Hz repetition frequency. FIG. 7(c) provides low magnification, and FIG. 7(d) provides high magnification. FIG. 7e. provides an image a layer of carbon nanotubes patterned by the present invention.

DETAILED DESCRIPTION OF THE INVENTION

Figures 1A, 1B:
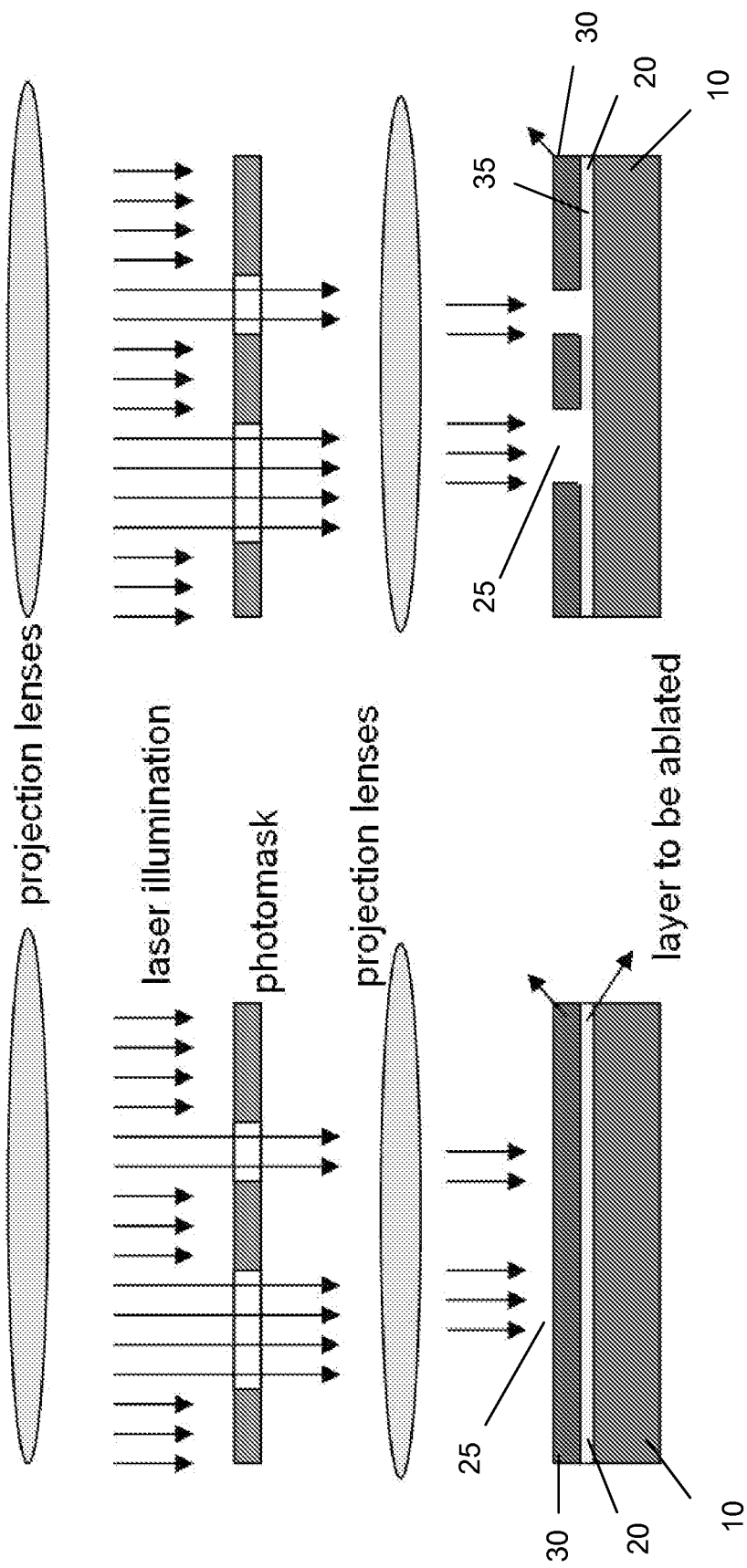
FIGS. 1A and 1B. Schematic diagrams showing an ablation-based patterning method of the present invention using patterned illumination.

Referring to the drawings, like numerals indicate like elements and the same number appearing in more than one drawing refers to the same element. In addition, hereinafter, the following definitions apply:

The term "electromagnetic radiation" and "light" are used synonymously in the present description and refer to waves of electric and magnetic fields. Electromagnetic radiation useful for the methods of the present invention include, but is not limited to ultraviolet light, visible light, infrared light, or any combination of these.

"Beam of electromagnetic radiation beam" refers to electromagnetic radiation propagating in substantially the same direction (i.e. beam divergence less than 5 degrees). In the present description, use of the term beam of electromagnetic radiation is intended to be consistent with use of this term in the art of optics, opto-electronics and spectroscopy. Beams of electromagnetic radiation beam useful in the methods of the present invention include coherent beams of electromagnetic radiation, pulses of electromagnetic radiation and continuous wave beams of electromagnetic radiation. Beams of electromagnetic radiation can be reformed or altered to be focusing, diverging, semicollimated or noncollimated.

"Ablatable" and "photoablatable" are used synonymously in the present description and refer to a material that is capable of undergoing photoablation. Photoablation refers to a process wherein material is removed upon exposure to sufficient radiant energies (e.g., greater than 10 mJ cm$^{-2}$) of electromagnetic radiation. In some photoablation processing methods, a large number of incident photons are delivered to a localized region of a layer of material over a very short time frame initiating a complex and rapid series of physical and chemical processes, including bond breaking and phase change processes. These processes cause a highly localized and unsustainable increase in volume and pressure resulting in ablation wherein material is release from the layer, for example in an ablation plume.

"Polymer" refers to a molecule comprising a plurality of repeating chemical groups, typically referred to as monomers. Polymers are often characterized by high molecular masses. Polymers useable in the present invention may be organic polymers or inorganic polymers and may be in amorphous, semi-amorphous, crystalline or partially crystalline states. Polymers may comprise monomers having the same chemical composition or may comprise a plurality of monomers having different chemical compositions, such as a copolymer. Cross linked polymers having linked monomer chains are particularly useful for some applications of the present invention.

"Fidelity" refers to a measure of the similarity of a pattern transferred to a substrate surface and a relief pattern on a patterning device. Good fidelity refers to similarities between a pattern transferred to a substrate surface and a relief pattern on a patterning device characterized by deviations less than 100 nanometers.

"Conformal contact" refers to contact established between one or more surfaces, including contact between the surface of a layer provided on a substrate surface undergoing processing. In one aspect, conformal contact involves a macroscopic adaptation a layer of ablatable material to the overall shape of a substrate surface. In another aspect, conformal contact involves a microscopic adaptation of a layer of ablatable material to a substrate surface leading to an intimate contact without voids. The term conformal contact is intended to be consistent with use of this term in the art of lithographic patterning.

"Target material: refers to a material to be patterned on a substrate or layer or structure provided on a substrate. Target materials particularly attractive for some applications of the present invention include porous materials, nanostructured materials, microstructured materials and layers thereof. As used herein, "providing a layer of target material on a surface of a substrate" refers to a process wherein a layer of target material is provided directly on a substrate surface or a process wherein a layer of target material is provided on a layer or structure supported by a substrate surface. In some embodiments, for example, "providing a layer of target material on a surface of a substrate" refers to providing a layer of target material on electronic devices or device components supported by a substrate undergoing processing.

"Porous" refers to a characteristic of a material having pores, voids or other recessed features, including channels, holes, chambers, grooves, passages and apertures. Porous materials may be capable of taking in fluids, such as photoablation assisting materials of the present invention. Porous materials can be micro-structured or nano-structured materials having pores, voids or other recessed features with cross sectional dimensions that are microsized and nanosized, respectively. In the present invention, pores, voids or other recessed features of porous target materials allow a photoablation assisting material to at least partially integrate into a layer of target material, for example, by diffusion, permeation or other transport processes. Porous materials may comprise layers of micro-structured or nano-structured materials, such as layers of carbon nanotubes or layers of nanowires. Porous materials useful for target materials may have a wide range of porosities including but not limited to, porosities ranging from 0.0001 to 0.99 (wherein porosity as used herein is defined as the ratio of the unoccupied volume (e.g., volume of the pores, pores, voids or other recessed features to the total volume of a material or layer).

In the following description, numerous specific details of the devices, device components and methods of the present invention are set forth in order to provide a thorough explanation of the precise nature of the invention. It will be apparent, however, to those of skill in the art that the invention can be practiced without these specific details.

The invention generally provides methods for patterning substrates with target materials including: (i) 3-D featured materials such as nano- and micro-structured materials including, but not limited to, carbon nanotubes (CNT), nanowires and other types of nanoparticles, and layers and other structures comprising nano- and micro-structured materials, and/or (ii) porous materials. Processing methods of present invention provide an alternative to conventional patterning by photolithography or high fluence, direct laser ablation methods. Processing advantages of the present methods relative to conventional patterning methods include a significant reduction in the overall costs of device fabrication as a result of a number of factors including: (1) the present methods requires less equipment resources for implementation: (2) the time for production is reduced due to the reduced number of process steps in the present methods, (3) the cost for equipment maintenance is reduced due to compatibility of the present methods with low fluence ablation conditions, and (4) usage of chemicals are reduced in the present methods relative to conventional photolithography, and therefore costly management of chemicals and waste is reduced.

Processing methods of the present invention are compatible with implementation using low fluence photoablation patterning conditions (e.g., ≤500 mJ cm$^{-2}$). Low fluence conditions are preferable to the high fluences often required for direct ablation patterning because: (1) damage or degradation to the substrate is reduced or eliminated, (2) damage or degradation to devices or device components prepatterned on the substrate is reduced or eliminated, (3) low fluence laser sources are cheaper to implement and easier to maintain, (4)

the need for maintenance and replacement of the photoablation optical system is lower when operated under low fluence conditions, (5) the lifetime of the optical system (e.g., lenses, photomask etc.) is longer when operated under low fluence conditions, and (6) safety concerns can be significantly reduced by using lower fluence ablation conditions. Another benefit of the present processing methods is that they can be implemented in a cost effective and simplified manner with fewer processing steps relative to conventional photolithography methods for patterning target materials.

The present invention generally relates to processing substrates by patterning functional materials for active or passive components for the production of electronic products, sensors, MEMS devices and other kinds of classes of electronic, opto-electronic and optical devices. The present methods are useful for patterning target materials on top of, and optionally in electrical contact with, underlying electronic devices and/or device components, and for patterning target materials in a manner such that they are capable of subsequent processing by providing electronic devices and/or device components on top of, and optionally in electrical contact with, the patterned target layer.

In an embodiment, useful for patterning target materials comprising nano-structured, micro-structured or porous materials, a layer of target material is provided on a surface of a substrate undergoing processing, for example by deposition, spin coating, spraying or printing techniques. A photoablation assisting material is coated on the target materials, for example by providing a layer of PAM onto a surface of the layer of target material provided on the substrate. For convenience, the abbreviation "PAM" for photoablation assisting material is used in certain aspects of the description and Figures in the application. In some embodiments wherein the target material is a nano-structured or micro-structured material or a porous material, the coating process results in PAM integrated with the target material such that it is provided underneath at least a portion of the target material, as well as on top of the target material. The PAM is ablated, for example using low fluence illumination conditions, and optionally patterned illumination conditions. In some embodiments, the PAM is patterned prior to photoablation processing, for example using photolithography, to define regions of the layer of target material integrated with PAM and regions of the target material without PAM. Target material chemically and/or physically associated with the PAM is removed along with the ablated PAM. In some embodiments, for example, the physical explosion during ablation of the PAM provides forces strong enough to remove target material chemically or physically associated with the PAM exposed to electromagnetic radiation. After selectively removing target material from regions of the layer, the remaining PAM is removed, for example via development or dissolution processing, thereby resulting in a pattern of target materials remaining on the substrate surface. This aspect of the invention takes advantage of processing conditions enabled by using PAMs capable of ablation at low fluences in a manner resulting in spatially selective removal of target material during the ablation process.

FIG. 1 provides a schematic diagram showing an ablation-based patterning method of the present invention using patterned illumination. In the illustrated method patterned illumination is provided by a conventional projection system having a photomask to define the pattern of target material generated on the substrate. As shown Panel (a) in FIG. 1, a substrate 10 is provided to be patterned with a target material. The substrate may be, for example, a device substrate prepatterned with electronic devices or device components. A layer of target material 20 is provided on a surface of the substrate 10 or device component or other structure supported by substrate 10. Next, a layer of photoablation assisting material (PAM) 30 is provided on the layer of target material 20 such that it at least partially integrates into layer of target material 20, for example by coating layer of target material 20 with a layer of PAM 30. The target material 20 integrated with PAM is exposed to electromagnetic radiation (schematically shown as arrows) having wavelengths and fluences sufficient cause ablation of the PAM. As shown in panels (a) and (b) of FIG. 1, patterned illumination is used in this specific embodiment to expose selected regions 25 of the layer of target material integrated with PAM to electromagnetic radiation. A photomask can be used to selectively illuminate the substrate. A projection lens images the illuminated region of the mask onto the substrate. Only the PAM and target material in the illuminated regions are ablated. Localized ablation of PAM generates forces that also provide for localized removal the target material. Accordingly, spatially localized ablation removal of target material generates a pattern comprising regions of target material 35 that is not exposed to electromagnetic radiation capable of initiating ablation of the PAM. Optionally, the remaining PAM is removed for example by developing, stripping, or dissolution processing (not shown in FIG. 1). If conventional photoresist is used as PAM, a stripper or acetone can be used to remove the remaining PAM layer without damaging the fabricated structures. If other kinds of PAM are used, a proper chemical that removes the PAM without damaging the structure or substrate is used.

Figure 2A:
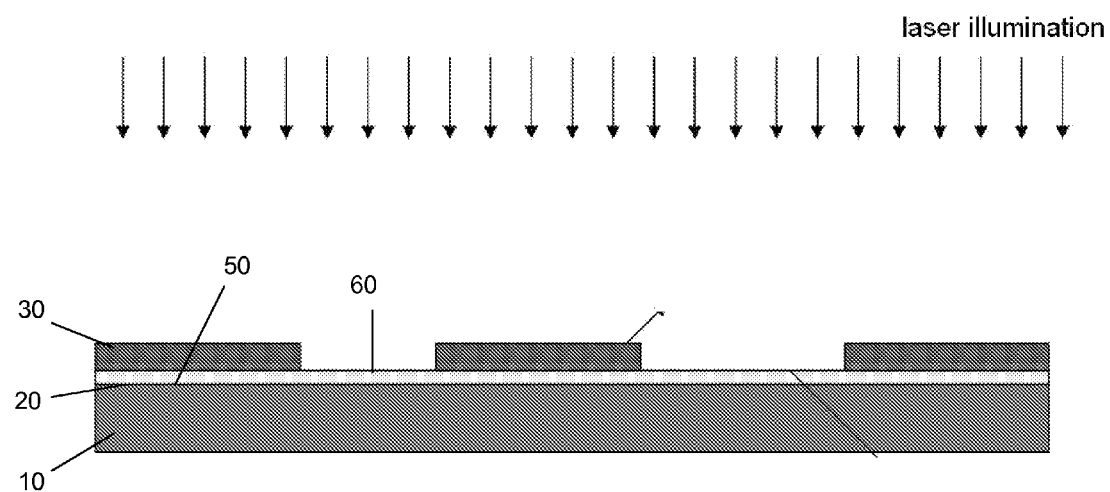
FIG. 2A and 2B. A schematic diagram showing an ablation-based patterning method of the present invention using flood illumination of patterned photoablation assisting material.
Figure 2B:
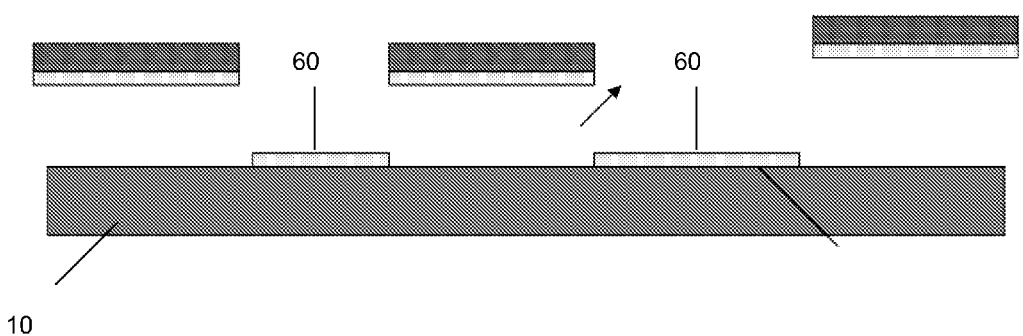

FIG. 2 provides a schematic diagram showing an ablation-based patterning method of the present invention using flood illumination of a patterned layer of photoablation assisting material provided to a layer of target material. In the illustrated method, patterned illumination is provided by a conventional projection system without requiring a photomask or other optical element(s) providing patterned illumination. As shown panel (a) of FIG. 2, a substrate 10 is provided to be patterned with a target material. The substrate may be, for example, a device substrate prepatterned with electronic devices or device components. A layer of target material 20 is provided on a surface of the substrate 10 or device component or other structure supported by the substrate 10. Next, a layer of photoablation assisting material (PAM) 30 is provided on layer of target material 20 such that it at least partially integrates into the layer of target material 20, for example by coating layer of target material 20 with a layer of PAM 30. As illustrated in panel (a), the PAM layer 30 is patterned prior to subsequent ablation processing, thereby generating regions of target materials integrated with PAM 50 and regions of target material without PAM 60. In an embodiment, for example, the PAM is patterned by conventional photolithography and developing/stripping processes. After patterning the PAM, the layer target material 20 is next exposed to electromagnetic radiation by flood illumination, for example, without using a photomask. The wavelength and fluence of the electromagnetic radiation (schematically illustrated by arrows) is selected be capable of initiating ablation of PAM, but not be capable of directly ablating target material in the absence of PAM. Ablation of PAM generates forces causing removal of regions target material integrated with PAM 50, but does not result in removal of regions of target material without PAM 60. Accordingly, the regions of the target material without PAM 60 remain because it is not ablated at the low fluence flood illumination conditions employed, thereby generating a pattern of target material on the surface of substrate 10.

Specific aspects, embodiments, and applications of the invention are further illustrated and described in the following non-limiting examples.

EXAMPLE 1

Patterning of Single Walled Carbon Nanotubes Using a Low-Fluence Excimer Laser Photoablation Process Abstract Carbon nanotube films were patterned by an excimer laser projection photoablation process at low incident energy conditions. The carbon nanotubes were deposited on a quartz substrate, and then a conventional photoresist was coated on it as a photoablation assisting material. The photoresist and the carbon nanotubes were patterned simultaneously by the projection photoablation process, and then the photoresist was removed. Due to the physical force of the ablation process, the carbon nanotubes were patterned cleanly even though the incident fluence on the carbon nanotubes was significantly lower than the threshold energy otherwise needed for their direct ablation.

Experimental Results

Carbon nanotubes have been researched as a possible important new component in various devices because they have a promising potential in applications such as microelectronic devices,[1-3] sensors,[4] actuators[5] and optoelectronic devices.[6] For the use of carbon nanotubes in such applications, and especially in mass fabrication, a pattering process for carbon nanotube layers that is compatible with CMOS (Complementary Metal Oxide Semiconductor) processes is necessary. There have been some reports in the literature on the patterning of carbon nanotubes, but either the reported methods were not compatible with CMOS processes or the capability for precise control of the pattern geometry was not good.[7] Patterning a catalyst and growing the carbon nanotubes on the patterned catalyst is a common method used in the fabrication of prototypes of flat-panel displays, but it is not compatible with CMOS processes.[8-9] S. Lu et. al. fabricated fine feature carbon nanotube patterns using oxygen plasma with a conventional photolithography process and a high-density plasma etching process.[7] In that study it was found that the oxygen plasma can generate defects in the carbon nanotubes, and further, the oxygen plasma also reacts with the defects in the carbon nanotubes. Therefore, although the carbon nanotubes could be etched under high-density oxygen plasma and the process can be used in some applications, the reported etch rate, 4 nm/s, was too slow to be of practical utility.[7]

Figure 3:
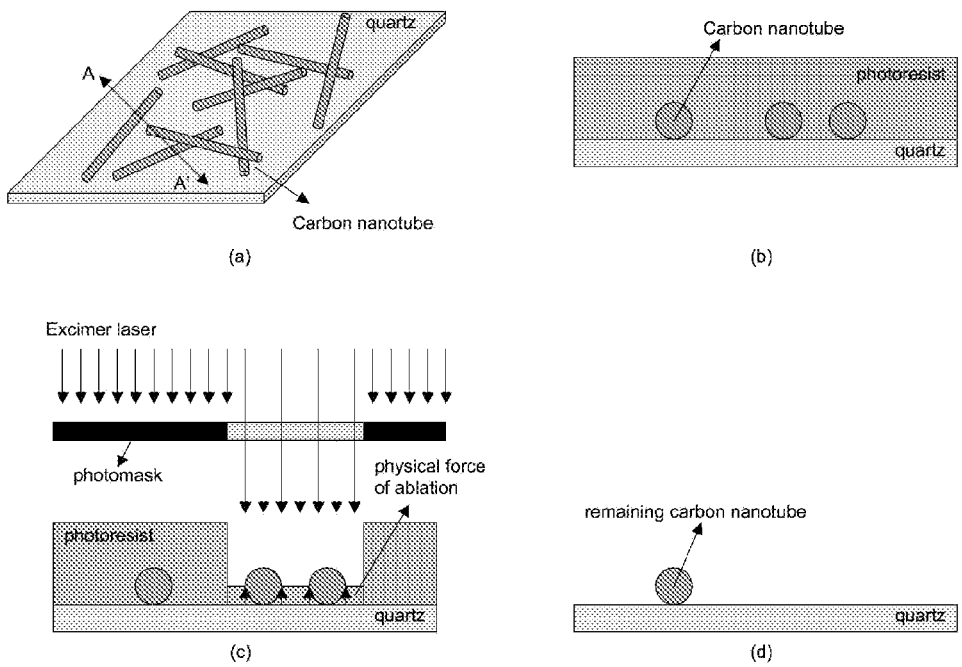
FIG. 3A-3D. A schematic illustrating concept of processing methods of the present invention. (a) A layer of a porous material or carbon nanotubes is deposited on a substrate. (b) The photoablation assisting material layer is coated on the target material to be patterned; the cross sectional view of AA' in (a) is illustrated. (c) Ablation of the photoablation assisting material layer and removal of the target material. (d) After ablation of the photoablation assisting material, it was removed and the final material patterns of the carbon nanotube film or other porous material remained.

In this Example, we describe a patterning method that can be used in the fabrication of devices and other applications which use carbon nanotubes as a component material. This method also can be used in the patterning of other porous materials. Further, the process is compatible with conventional microelectronic fabrication processes and it is high-speed. FIG. 3(a)~(d) illustrate the concept of this method. Before the patterning of the target material, i.e., the carbon nanotube layer or other porous material, it is deposited on the substrate as illustrated in FIG. 3(a). We deposited carbon nanotubes as a target material in these experiments.

Single walled carbon nanotubes were grown on AT-cut quartz. Ferritin catalyst (Aldrich) diluted 1:20 by volume with deionized water was cast onto the substrate. A high concentration of catalyst on a double sided polished, unannealed quartz substrate was used to obtain a random network of tubes.[10] The transparency of the quartz ensures that it is not ablated in the process and does not interfere with the ablation of the carbon nanotubes. The catalyst was oxidized in air by heating it up to 800° C. and cooling it back to room temperature. Heating to 925° C. in hydrogen in a 20 sccm flow of hydrogen and 20 sccm flow of argon bubbled through ethanol for 15 minutes yielded random networks of individual single walled tubes. After the growth, the samples were cooled back to room temperature slowly to prevent the quartz substrate from cracking.

After the deposition of the target material, a photoablation assisting material layer was coated on it. We used a conventional photoresist, MicroChem AZ4620 or MicroChem S1818, as the photoablation assisting material and it was coated on the carbon nanotube layer as shown in FIG. 3(b). The photoresist deposition process causes the resist to be placed under the carbon nanotubes as well as on top of the carbon nanotubes because liquid phase photoresist was coated and baked. After the coating of the photoablation assisting material, it was ablated using pulsed excimer laser radiation as shown in FIG. 3(c). We used deep ultraviolet (DUV) radiation from a KrF excimer laser at 248 nm wavelength, and the exposures were carried out using a projection imaging configuration for the photoablation process in our experiments. The laser had a pulse repetition rate of 5 Hz, and provided an energy fluence of 250~600 mJ/cm$^2$ at the substrate. When the photoresist under the carbon nanotubes gets ablated during the laser photoablation process, the physical force of dissociated fragments of the photoresist also removes the carbon nanotubes above it. Although, as reported previously, the carbon nanotubes can be ablated directly by the conventional ablation process, the exposure fluence required is very high (several J/cm$^2$). In comparison, with the process we report, the carbon nanotubes can be patterned with a much lower fluence of illumination by using a photoablation assisting material layer. After the photoablation of the photoresist, the patterned photoresist on the sample was removed in an acetone rinse, leaving behind patterned carbon nanotubes, as illustrated in FIG. 3(d).

Figure 4:
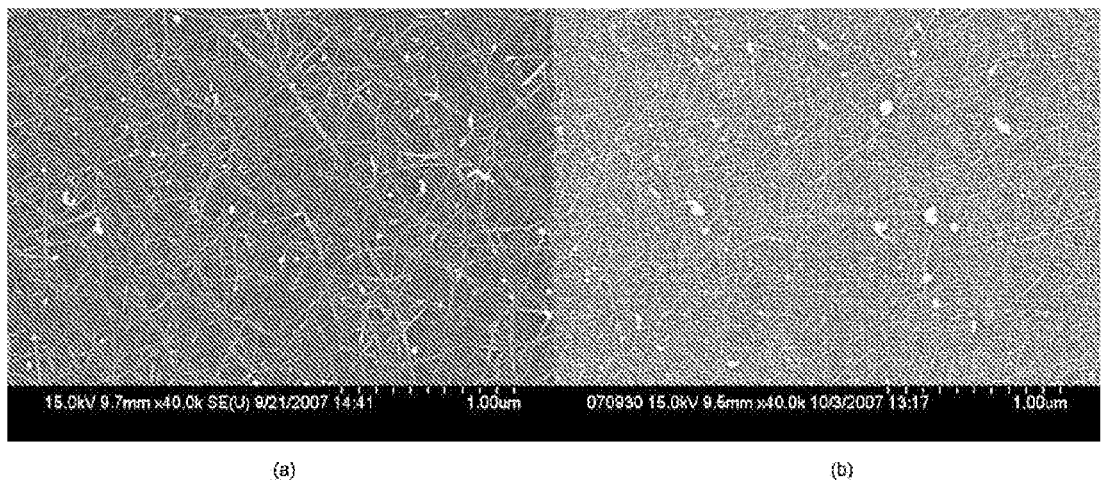
FIG. 4A and 4B. SEM photographs of carbon nanotube films. (a) Initial carbon nanotubes on a quartz substrate. (b) Carbon nanotubes after exposure by excimer laser radiation. The exposure fluence was 590 mJ/cm$^2$ and the number of pulses was 500. Note that the carbon nanotubes are neither ablated nor damaged.

Before carrying out the present method, we investigated the direct ablation characteristics of the carbon nanotubes using our excimer laser ablation system. FIG. 4(a) shows an SEM image of initial carbon nanotubes deposited on a quartz substrate, and FIG. 4(b) shows the carbon nanotubes after excimer laser exposure. The incident fluence of the laser illumination was 590 mJ/cm$^2$ and the number of pulses was 500. It is clear that the carbon nanotubes neither damaged nor ablated at the fluence of 590 mJ/cm$^2$. The threshold for direct ablation of carbon nanotubes is therefore higher than 590 mJ/cm$^2$.

Figure 5:
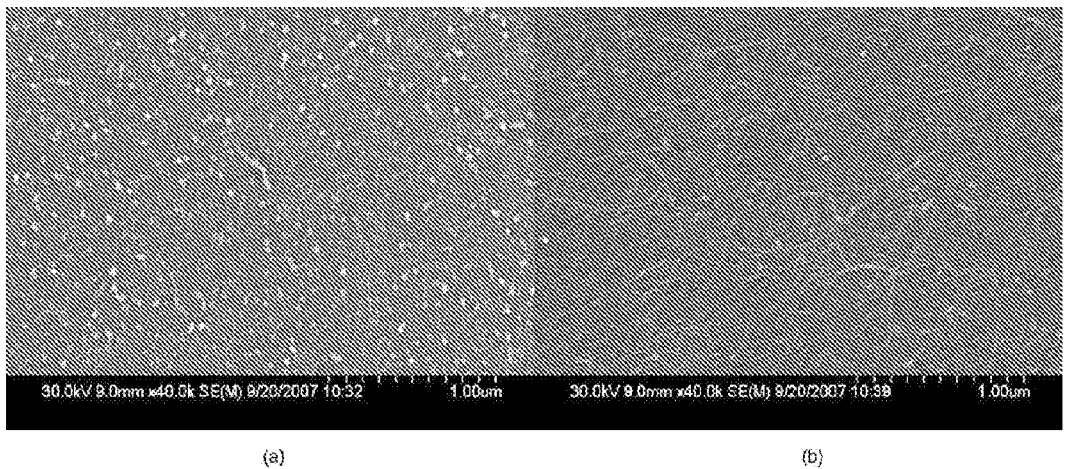
FIG. 5A and 5B. SEM photographs of carbon nanotubes taken after removing the photoresist. (a) The carbon nanotubes were removed during the ablation process at an incident fluence of 270 mJ/cm$^2$. (b) The carbon nanotube in the non-illuminated area were remained intact without any change.

In order to demonstrate the method of this Example, we coated a photoresist, AZ4620, on the carbon nanotube layer, with a thickness of 3.5 μm. After coating the photoresist, we illuminated the sample with the excimer laser imaging system to photoablate the sample at an exposure fluence of 270 mJ/cm$^2$. The number of incident laser pulses was 100. We used a metal hardmask between the illumination source and the sample to make a square pattern on the substrate. The metal hardmask had a 2 mm×2 mm square aperture. After the photoablation of the sample, the photoresist was removed in an acetone rinse and an SEM picture was taken as shown in FIG. 5(a). All the carbon nanotubes were removed after the photoablation process even though the fluence of illumination was less than the conditions in FIG. 4. The white dots in the SEM image are attributed to a catalyst material which is used in the deposition process of the carbon nanotubes. FIG. 5(b) is an SEM image of the same sample which was taken in the non-illuminated region. As seen, the initial carbon nanotubes remain intact after the process without any change. Thus, from the results shown in FIG. 4 and FIG. 5, it is clear that the carbon nanotube film can be patterned by the low-fluence photoablation process when a photoablation assisting material is used, even though the fluence of illumination is lower than the threshold value for direct photoablation.

We used an excimer laser projection imaging configuration to produce patterns of carbon nanotubes using the present method. Flowing Nitrogen gas was used to remove the debris which is generated during the photoablation of the photoresist. We used MicroChem S1818 photoresist as the photoablation assisting material; it had a thickness of 2.2 μm. The fluence of illumination was 590 mJ/cm$^2$ at the substrate. The fluence was high due to certain specific parameters of the projection illumination system. After the photoablation of the photoresist, we removed the remaining photoresist using an acetone rinse and patterns of carbon nanotubes were fabricated as shown in FIG. 6(a) and (b). The patterns of carbon nanotubes were clean and sharp. Also, note that fabrication of fine feature patterns of carbon nanotubes was possible. The number of incident illumination pulses was 9; therefore, only 2 seconds were required for the patterning process at the 5 Hz repetition rate conditions.

Figure 6:
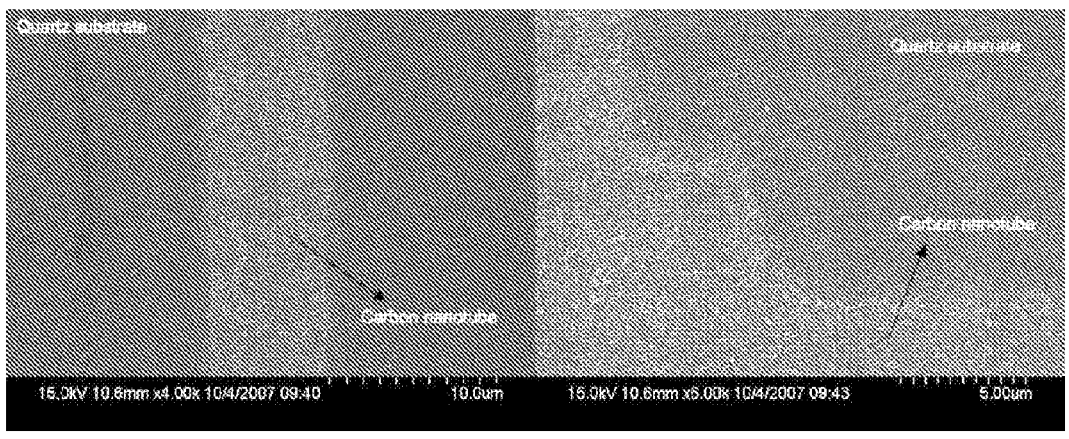
FIG. 6A and 6B. SEM photographs of patterned carbon nanotubes which were fabricated using an excimer laser projection imaging system. The exposure fluence was 590 mJ/cm$^2$ and the number of pulses was 9. (a) Line-patterned carbon nanotubes. (b) Patterns of carbon nanotubes with a corner and a line shape.

As shown by the results in FIG. 5 and FIG. 6, it is clear that the carbon nanotubes can be patterned under low-fluence conditions when a photoablation assisting material is used. This method can be used in the patterning of various porous materials as well as carbon nanotubes if the materials have sufficient porosity to enable incorporation of a photoablation assisting material in their voids. There are some required characteristics for a photoablation assisting material to be suitable for this process concept. It should have a low threshold fluence of photoablation and one should be able to place it under or in the main (i.e., target) material to be ablated. Also, the photoablation assisting material should be easily removable without damaging the main material after the photoablation process. There are many materials that can be used as the photoablation assisting material, but a suitable photoresist would be the best choice. Some photoresists have all the required properties mentioned above. The photoresist is liquid so that it can be incorporated both under the carbon nanotubes and in the porous material. It commonly has a very low energy threshold for excimer laser photoablation and can be removed easily using a photoresist stripper or an acetone rinse. Most importantly, the photoresist is a common material in the microelectronic fabrication process.

This carbon nanotube patterning method has several merits compared with conventional patterning methods described previously. The fluence of illumination required for the process is low so that the damage on the devices or substrate can be minimized. Many photoresists can be ablated at fluence below 200 mJ/cm$^2$.[11-13] The patterning process is fast because the patterns are generated by a one-step process; it does not require the conventional photolithography steps of photoresist development and an etching process to make the patterns. Also, this method does not require vacuum processes such as oxygen plasma etching, so that the benefits of process simplification become greater.

In conclusion, we have developed a new patterning method using excimer laser photoablation for patterning of carbon nanotubes and other porous materials. With a fluence of illumination that is significantly lower than the threshold value for direct photoablation, the materials can be patterned when a photoablation assisting material layer is used. We fabricated patterns of carbon nanotubes on a quartz substrate using a photoresist as a photoablation assisting material under low-fluence photoablation conditions, and demonstrated patterns of carbon nanotube films that are clean and sharp.

References

1. M. A. Meitl, Y. Zhou, A. Gaur, S. Jeon, M. L. Usrey, M. S. Strano and J. A. Rogers, Nano Lett. 4, no. 9,1643 (2004).
2. X. Liu, C. Lee and C. Zhou, Appl. Phys. Lett. 79, 3329 (2001).
3. R. Martel, Nature Mat. 1, 203 (2002).
4. P. Dharap, Z. Li, S. Nagarajaiah and E. V. Barrera, Nonotech. 15, 379 (2004).
5. A. M. Fennimore, T. D. Yuzvinsky, W-Q. Han, M. S. Fuhrer, J. Cumings and A. Zetti, Nature 424, 408 (2003).
6. A. D. Pasquier, H. E. Unalan, A. Kanwal, S. Miller and M. Chhowalla, Appl. Phys. Lett. 87, 203511 (2005).
7. S. Lu and B. Panchapakesan, Appl. Phys. Lett. 88, 253107 (2006).
8. W. B. Choi, Y. W. Jin, H. Y. Kim, S. J. Lee, M. J. Yun, J. H. Kang, Y. S. Choi, N. S. Park, N. S. Lee and J. M. Kim, Appl. Phys. Lett. 78, no. 11,1547 (2001).
9. W. B. Choi, D. S. Chung, J. H. Kang, H. Y. Kim, Y. W. Jin, I. T. Han, Y. H. Lee, J. E. Jung, N. S. Lee, G. S. Park and J. M. Kim, Appl. Phys. Lett. 75, no. 20, 3129 (1999).
10. C. Kocabas, N. Pimparkar, 0. Yesilyurt, S. J. Kang, M. A. Alam and J. A. Rogers, Nano Lett. 7 (5), 1195 (2007)
11. K. Jain, *Excimer Laser Lithography*, SPIE Press, Bellingham, Wash., 1990, pp. 176-189.
12. W. W. Duley, *UV Lasers*, Cambridge University Press, Cambridge, UK, 1996.
13. R. Srinivasan and V. Mayne-Banton, Appl. Phys. Lett. 41, 576 (1982).

EXAMPLE 2

Patterning of Porous Materials

Porous materials are important components used in sensors and biomedical applications. The present invention provides processing capable of patterning porous target materials, including porous materials that are difficult to pattern via direct laser ablation methods. In some embodiments, an AMM layer is provided in contact with the porous target material in a manner such that the PAM is provided under the porous material or within the pores of the porous material. Upon exposure to electromagnetic radiation having sufficient wavelengths and fluences to initiate ablation of the AMM, forces generated during ablation result in removal of porous material integrated with the PAM.

EXAMPLE 3

Removal of Photoablation Debris and/or Byproducts After or During Photoablation

The present invention includes processing wherein photoablation debris generated by photoablation of the photoablation assisting material and target material is removed via one or more processing steps. This aspect of the present invention is particularly useful for patterning in nano- and micro-electronics applications wherein such photoablation debris can degrade performance.

Figure 7A:
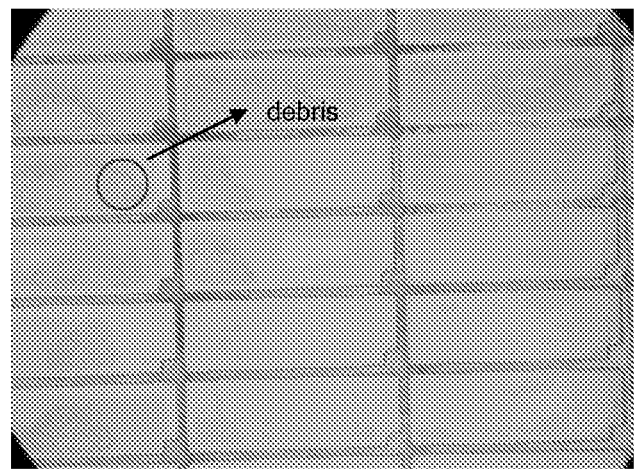
FIGS. 7(a)-7(e).
Figure 7B:
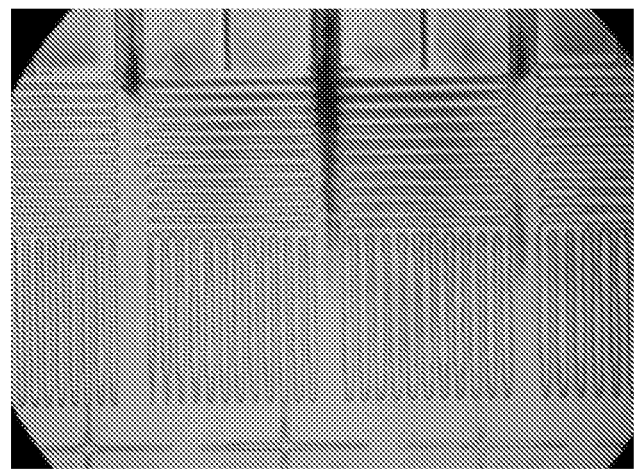

After photoablation of photoablation assisting materials, such as polymers and/or photoresist, thin layer (monolayer or some layers of hydrocarbon byproducts) of photoablation debris (e.g., residue and/or byproducts) can remain on the ablated area. For example, some debris remains after ablation of photoresist as shown in FIG. 7(a) and 7(b). FIGS. 7a and 7b provide optical microscopic photographs of patterned photoresist. The incident excimer laser fluence was 50 mJ cm$^{-2}$ and the number of pulses was 40. FIG. 7a shows patterns obtained using a pixel photomask, and FIG. 7b shows patterns obtained using a line photomask.

Figure 7C:
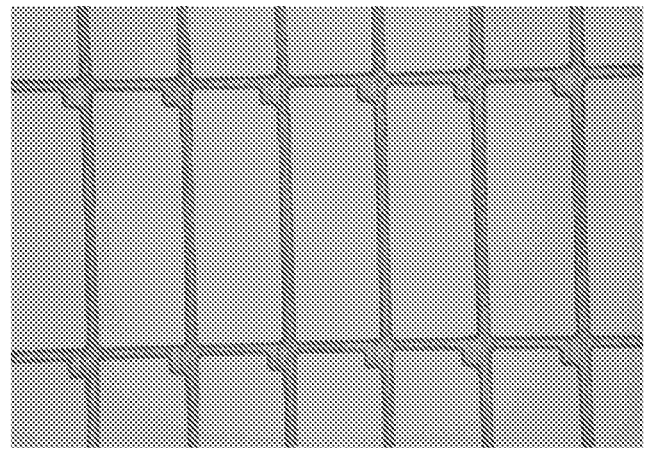
Figure 7D:
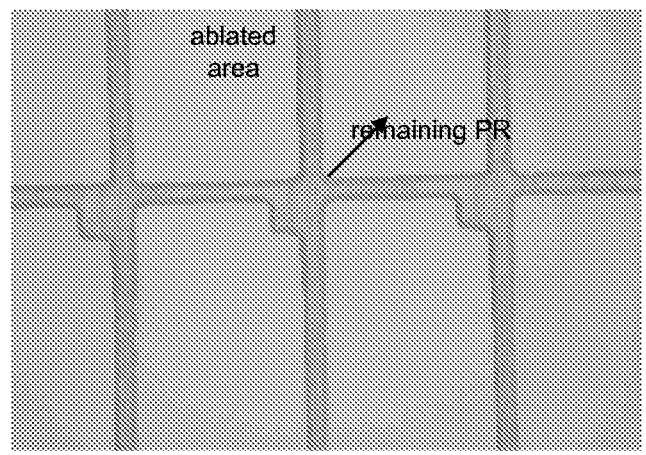

After oxygen plasma treatment of the samples shown in FIG. 7(a) and 7(b), the debris is removed as shown in FIGS. 7(c) and 7(d). FIGS. 7(c) and 7(d) provide optical microscope photographs of patterns formed in 2.2 μm thick photoresist layer on a KrF excimer laser photoablation workstation using a fluence of 50 mJ/cm2 at the substrate and 30 pulses at 5 Hz repetition frequency. FIG. 7(c) provides low magnification, and FIG. 7(d) provides high magnification.

Figure 7E:
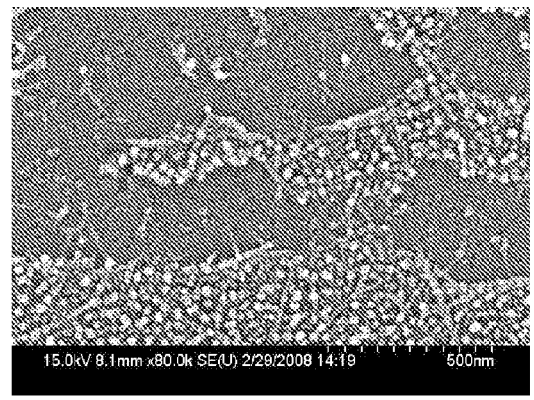

In the patterning of carbon nanotubes by the present invention, removed carbon nanotubes can result in photoablation debris (e.g., byproducts). FIG. 7e. provides an image of a layer of carbon nanotubes patterned by the present invention. As shown in FIG. 7e, the carbon nanotube is dissociated but some byproducts are shown to remain in the ablated region. This photoablation debris can be effectively removed in the present invention by exposure to a plasma, such as an oxygen plasma.

For some fabrication applications of the present invention, photoablation debris (e.g., residue and/or byproduct) are preferably removed cleanly. For removing these material, a range of processing techniques can be used. In an embodiment, an oxygen plasma treatment is used to remove these byproducts, as oxygen plasma readily removes carbon-based byproducts. Alternatively, hydrogen plasma or other type of gas plasma also can be used for removing of photoablation byproducts. Alternatively, chemical treatment is used to remove photoablation debris, for example, by application of chemicals, such as acids, organic solvents or bases, to the processed surface. In some embodiments for the patterning of carbon nanotubes, for example, photoablation debris (e.g., byproducts) is removed by exposure of photoablation debris to one or more acids.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The following references provide description of photoablation techniques, systems and process conditions and are hereby incorporated by reference in their entireties: (1) J. Chae et al., "Patterning of Indium Tin Oxide by Projection Photoablation and Lift-Off Process for Fabrication of Flat-Panel Displays", Appl. Phys. Lett., Vol. 90, No. 26, p. 261102, Jun. 25, 2007, (2) R. Huemoeller et al., "Unveiling the Next Generation in IC Substrate Circuit Formation", CircuiTree, Vol. 20, No. 6, p. 12, June 2007; (3) K. Jain et al., "Flexible Electronics and Displays: High-Resolution, Roll-to-Roll, Projection Lithography and Photoablation Processing Technologies for High-Throughput Production", Proc. IEEE, Vol. 93, No. 8, p. 1500, August 2005; (4) K. Jain et al., "Large-Area, High-Resolution Lithography and Photoablation Systems for Microelectronics and Optoelectronics Fabrication", Proc. IEEE, Vol. 90, No. 10, p. 1681, October 2002.; (5) K. Jain et al., "Large-Area Excimer Laser Lithography and Photoablation Systems", Microlithography World, Vol. 11, No. 3, p. 8, August 2002; (6) Excimer laser projection photoablation and lift-off process for patterning of indium-tin-oxide for cost effective fabrication of flat-panel displays", Proceedings of SPIE, Vol. 6911, 69110P (2008)); and (7) M. Klosner et al., "High-Resolution, Large-Area Projection Lithography Offers a New Alternative for Wafer-Level Packaging", Chip Scale Review, Vol. 6, No. 4, p. 75, July 2002.

Figure 8:
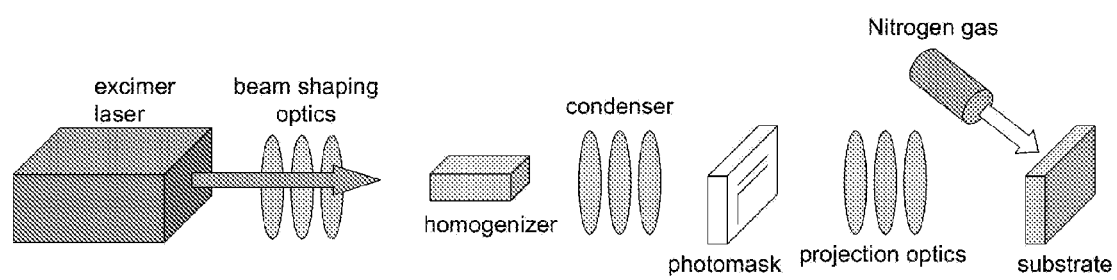
FIG. 8. A schematic showing an exemplary system for photoablation processing useful for the present invention

In some embodiments of the present methods, for example, deep ultraviolet radiation from an excimer laser is used in a projection imaging configuration for the polymer photoablation process. The set up allows control of the laser repetition frequency and the fluence of the illumination. Optionally, a beam homogenizer is used in the optical system to make the illumination on the substrate uniform. Flowing gas (e.g., nitrogen, or other gases) can be used at the substrate to remove the generated debris from the substrate.]. FIG. 8 provides a schematic showing an exemplary system for photoablation processing useful for the present invention. As shown in this Figure, electromagnetic radiation from an excimer laser is passed through beam shaping optics and subsequently through a homogenizer and condenser. Output from the condenser is provided to a photomask and projection optics to provide patterned ablation of a substrate surface. Optionally, a flow of carrier gas, e.g., nitrogen gas, is provided to the substrate surface during and/or after photoablation processing for the purpose of removal of photoablation debris.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Many of the molecules disclosed herein contain one or more ionizable groups [groups from which a proton can be removed (e.g., —COOH) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this invention for a given application. In specific applications, the selection of a given anion or cation for preparation of a salt may result in increased or decreased solubility of that salt.

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method for patterning a substrate with a microstructured or nanostructured target material, said method comprising the steps of:
   providing a layer of said target material on a surface of said substrate;
   contacting said layer of target material with a photoablation assisting material, wherein said photoablation assisting material at least partially integrates into said layer of target material, thereby generating a layer of target material integrated with said photoablation assisting material; and
   exposing selected regions of said layer of target material integrated with said photoablation assisting material to electromagnetic radiation in the ultraviolet region of the electromagnetic spectrum having wavelengths and a fluence sufficient to initiate removal of the photoablation assisting material, thereby generating a force which removes a portion of said target material in the layer of target material integrated with said photoablation assisting material, wherein said wavelengths and said fluence of said electromagnetic radiation do not result in direct ablation of said target material;
   thereby patterning said substrate with said microstructured or nanostructured target material.

2. The method of claim 1 wherein said photoablation assisting material partially integrates into said layer of target material.

3. The method of claim 1 wherein said photoablation assisting material completely integrates into the entire thickness of said layer of target material.

4. The method of claim 1 wherein said contacting step provides photoablation assisting material into the bulk of said layer of target material.

5. The method of claim 1 wherein said contacting step provides photoablation assisting material underneath at least a portion of said layer of target material.

6. The method of claim 1 wherein said layer of target material comprises a porous material having a plurality of microsized or nanosized pores; wherein said photoablation assisting material is integrated into at least a portion of said microsized or nanosized pores.

7. The method of claim 1 wherein said layer of target material has a plurality of microsized or nanosized features; wherein said photoablation assisting material is integrated into at least a portion of said microsized or nanosized features.

8. The method of claim 1 wherein said layer of target material comprises a layer of nanoparticles, microparticles or both; wherein said photoablation assisting material is integrated into spaces between at least a portion of said nanoparticles, microparticles or both of said layer of target material.

9. The method of claim 1 wherein said layer of target material comprises a layer of nanoparticles, microparticles or both; wherein said photoablation assisting material coats at least a portion of said nanoparticles, microparticles or both of said layer of target material.

10. The method of claim 1 wherein said layer of target material comprises single walled or multiwalled carbon nanotubes.

11. The method of claim 1 wherein said layer of target material comprises metallic, semiconducting or dielectric nanowires.

12. The method of claim 11 wherein said layer of target material comprises semiconducting nanowires selected from the group consisting of InP, Si, ZnO and GaN nanowires, dielectric nanowires selected from the group consisting of $SiO_2$ and $TiO_2$ nanowires or metallic nanowires selected from the group consisting of Ni, Pt, ZnO and Cu nanowires.

13. The method of claim 1 wherein said layer of target material has a thickness selected over the range of 5 nm to 1000 microns.

14. The method of claim 1 wherein said step of contacting said layer of target material with a photoablation assisting material comprises: providing a layer of said photoablation assisting material onto a surface of said layer of target material.

15. The method of claim 14 further comprising the step of: patterning said layer of photoablation assisting material by removing photoablation assisting material from selected regions of said layer of photoablation assisting material.

16. The method of claim 1 wherein said exposing step is carried out by patterned exposure of said electromagnetic radiation to said layer of target material integrated with said photoablation assisting material.

17. The method of claim 1 wherein said photoablation assisting material is patterned on said layer of target material prior to said exposing step; wherein said exposing step is carried out using flood exposure with said electromagnetic radiation, wherein said removal is spatially restricted to regions of said layer of target material integrated with said photoablation assisting material.

18. The method of claim 1 wherein said exposing step is carried out using a fluence of said electromagnetic radiation less than or equal to 500 mJ cm$^{-2}$.

19. The method of claim 1 further comprising the step of removing said photoablation assisting material after said step of removing target material, wherein said photoablation assisting material is removed by developing, stripping or dissolution.

20. The method of claim 1 wherein said photoablation assisting material comprises a polymer, or a photoresist.

21. The method of claim 20 wherein said photoablation assisting material is selected from the group consisting of polymethylmethacrylate (PMMA), polyimide, polyethylene terephthalate (PET), polystyrene, polycarbonate, polyvinyl alcohol (PVA), polybenzimidazole, and tetrafluoroethylene.

22. The method of claim 1 wherein the photoablation assisting material has a viscosity selected over the range of 0.1 mPa·s to 500 MPa·s.

23. The method of claim 1 wherein said target material comprises one or more nanoparticle materials selected from the group consisting of single walled carbon nanotubes (SWNTs), multiwalled carbon nanotubes (MWNTs), carbon nanotube bundles, fullerenes, carbon fibers, semiconducting nanowires, metallic nanowires and dielectric nanowires.

24. The method of claim 1 wherein said step of providing a layer of said target material comprises one or more steps selected from the group consisting of:
  growing carbon nanotubes on said surface of said substrate using chemical vapor deposition;
  contacting said surface of said substrate with a solution of carbon nanotubes;
  providing carbon nanotubes by arc-discharge carbon nanotube deposition, and
  providing carbon nanotubes by laser-ablation carbon nanotube deposition.

25. The method of claim 1 wherein said surface of said substrate is prepatterned with one or more electronic device components of an integrated circuit.

26. The method of claim 1 further comprising the step of fixing the photoablation assisting material integrated into the target material prior to said step of removing target material by photoablation.

27. The method of claim 26 wherein said step of fixing the photoablation assisting material integrated into the target material is carried out by one or more processes selected from the group consisting of curing, hardening, solidifying, exposure to electromagnetic radiation, exposure to one or more curing agents, raising the temperature, baking, and cross linking of said photoablation assisting material.

28. The method of claim 1 further comprising the step of removing photoablation debris generated by said step of removing target material by photoablation.

29. The method of claim 28 wherein said step of removing photoablation debris is carried out by providing a flow of carrier gas to the surface of said substrate or is carried out by exposing said photoablation debris to a plasma, a reactive gas, a reactive liquid or a combination of these.

30. The method of claim 1 wherein said electromagnetic radiation is produced by an excimer laser.

31. A method for patterning a substrate with nanotubes or nanowires, said method comprising the steps of:
  providing a layer of said nanotubes or nanowires on a surface of said substrate;
  contacting said layer of nanotubes or nanowires with a photoablation assisting material, wherein said photoablation assisting material is integrated into spaces between at least a portion of said nanotubes or nanowires of said layer, thereby generating a layer of nanotubes or nanowires integrated with said photoablation assisting material; and
  exposing selected regions of said layer of nanotubes or nanowires integrated with said photoablation assisting material to electromagnetic radiation in the ultraviolet region of the electromagnetic spectrum having wavelengths and a fluence sufficient to initiate removal of the photoablation assisting material, thereby generating a force which removes a portion of said nanotubes or nanowires in the layer of nanotubes or nanowires integrated with said photoablation assisting material, wherein said wavelengths and said fluence of said electromagnetic radiation do not result in direct ablation of said target material;
  thereby patterning said substrate with said nanotubes or nanowires.

32. The method of claim 31 wherein said step of providing a layer of said nanotubes or nanowires comprises growing carbon nanotubes on said surface of said substrate using high temperature chemical vapor deposition.

33. The method of claim 31 wherein said step of contacting said layer of said nanotubes or nanowires with a photoablation assisting material comprises:
  providing a layer of said photoablation assisting material onto a surface of said layer of said nanotubes or nanowires.

34. The method of claim 33 wherein said layer of said photoablation assisting material provided to said layer of said nanotubes or nanowires has a thickness selected over the range of 10 nm to 1000 microns.

35. The method of claim 33 further comprising the step of: patterning said layer of photoablation assisting material by removing photoablation assisting material from selected regions of said layer of nanotubes or nanowires.

36. The method of claim 31 wherein said electromagnetic radiation has wavelengths that are not absorbed sufficiently by said nanotubes or nanowires, or has energy that is not sufficient, to be able to dissociate them.

37. The method of claim 31 wherein said exposing step is carried out using a fluence of said electromagnetic radiation less than or equal 500 mJ cm$^{-2}$.

38. The method of claim 31 wherein said nanotubes or nanowires are one or more materials selected from the group consisting of single walled nanotubes, multiwalled nanotubes, carbon nanotube bundles, semiconducting nanowires, metallic nanowires and dielectric nanowires.

39. The method of claim 31 wherein said photoablation assisting material is selected from the group consisting of polymethylmethacrylate (PMMA), polyimide, polyethylene terephthalate (PET), polystyrene, polycarbonate, polyvinyl alcohol (PVA), polybenzimidazole, and tetrafluoroethylene.

40. The method of claim 31 further comprising the step of fixing the photoablation assisting material integrated into said nanotubes or nanowires prior to said step of removing said nanotubes or nanowires by photoablation.

41. The method of claim 31 further comprising the step of removing photoablation debris generated by said step of removing said nanotubes or nanowires by photoablation.

42. The method of claim 41 wherein said step of removing photoablation debris is carried out by:
   providing a flow of carrier gas to the surface of said substrate; and
   exposing said photoablation debris to a plasma, a reactive gas or a reactive liquid.

43. The method of claim 31 wherein said electromagnetic radiation is produced by an excimer laser.

* * * * *